(12) United States Patent
Arishiro et al.

(10) Patent No.: US 8,657,987 B2
(45) Date of Patent: Feb. 25, 2014

(54) MANUFACTURING APPARATUS FOR MANUFACTURING ELECTRONIC MONOLITHIC CERAMIC COMPONENTS

(75) Inventors: Masatoshi Arishiro, Sabae (JP); Masami Yamaguchi, Takefu (JP); Tetsuro Saito, Okayama (JP)

(73) Assignee: Murata Manufacturing Co., Ltd., Nagaokakyo-Shi, Kyoto-Fu (JP)

( * ) Notice: Subject to any disclaimer, the term of this patent is extended or adjusted under 35 U.S.C. 154(b) by 592 days.

(21) Appl. No.: 11/407,085

(22) Filed: Apr. 20, 2006

(65) Prior Publication Data

US 2006/0185782 A1 Aug. 24, 2006

Related U.S. Application Data

(62) Division of application No. 09/893,399, filed on Jun. 29, 2001, now Pat. No. 7,383,866.

(30) Foreign Application Priority Data

Jul. 31, 2000 (JP) .................................. 2000-231086

(51) Int. Cl.
| | |
|---|---|
| *C03B 8/00* | (2006.01) |
| *B29C 65/56* | (2006.01) |
| *B32B 37/02* | (2006.01) |
| *B32B 37/10* | (2006.01) |
| *B32B 37/26* | (2006.01) |
| *B32B 38/04* | (2006.01) |
| *B32B 38/16* | (2006.01) |
| *B32B 38/18* | (2006.01) |

(52) U.S. Cl.
USPC ........ 156/252; 156/89.12; 156/250; 156/267; 156/510

(58) Field of Classification Search
USPC ........................ 156/89.12, 252, 267, 250, 510
See application file for complete search history.

(56) References Cited

U.S. PATENT DOCUMENTS 4,497,677 A * 2/1985 Sanada et al. .............. 156/89.12
5,130,067 A * 7/1992 Flaitz et al. .................... 264/669

(Continued)

FOREIGN PATENT DOCUMENTS

JP 62-124947 * 6/1987
JP 62124947 A * 6/1987

(Continued)

OTHER PUBLICATIONS

Japanese Office Action; Dispatch No. 155422; Dispatch Date: May 10, 2005.

(Continued)

*Primary Examiner* — Sonya Mazumdar
(74) *Attorney, Agent, or Firm* — Buchanan Ingersoll & Rooney PC

(57) ABSTRACT

A manufacturing apparatus for manufacturing electronic monolithic ceramic components, including a sheet supplier for supplying a plurality of ceramic green sheets of a plurality of types in a predetermined order, and a laminator for laminating the ceramic green sheets supplied by the sheet supplier. A plurality of trays is set in two vertical columns in a rack which is vertically movable. Each tray holds a stack of a plurality of ceramic green sheets of the same type. A particular tray positioned to a predetermined level by the vertical movement of the rack is drawn by a tray drawer device, and one ceramic green sheet is picked up from the tray, and is then conveyed to the laminator. The utilization efficiency of area in the sheet supplier is thus increased.

8 Claims, 13 Drawing Sheets

(56) References Cited

U.S. PATENT DOCUMENTS

| | | | |
|---|---|---|---|
| 5,274,916 A * | 1/1994 | Kawabata et al. | 29/848 |
| 5,370,760 A * | 12/1994 | Mori et al. | 156/89.16 |
| 5,468,315 A * | 11/1995 | Okada et al. | 156/64 |
| 5,474,741 A * | 12/1995 | Mikeska et al. | 427/376.7 |
| 5,783,026 A * | 7/1998 | Natarajan et al. | 156/378 |
| 5,876,539 A * | 3/1999 | Bailey et al. | 156/89.16 |
| 6,109,323 A | 8/2000 | Baccini | |

FOREIGN PATENT DOCUMENTS

| | | | |
|---|---|---|---|
| JP | 63-158204 | | 7/1988 |
| JP | 63-265413 | * | 11/1988 |
| JP | 63265413 A | * | 11/1988 |
| JP | 1-208130 | * | 8/1989 |
| JP | 01208130 A | * | 8/1989 |
| JP | 2-185097 | * | 7/1990 |
| JP | 02185097 A | * | 7/1990 |
| JP | 4-211195 | | 8/1992 |
| JP | 4-239604 | | 8/1992 |
| JP | 4-305997 | * | 10/1992 |
| JP | 04305997 A | * | 10/1992 |
| JP | 5-46068 | | 6/1993 |
| JP | 5-167253 | * | 7/1993 |
| JP | 5-183270 | | 7/1993 |
| JP | 05167253 A | * | 7/1993 |
| JP | 6-84724 | | 3/1994 |
| JP | 6-246730 | | 9/1994 |
| JP | 6-255814 | | 9/1994 |
| JP | 6-312417 | * | 11/1994 |
| JP | 06312417 A | * | 11/1994 |
| JP | 7-10277 | | 1/1995 |
| JP | 7-86746 | | 3/1995 |
| JP | 9-104016 | | 4/1997 |
| JP | 10-321457 | | 12/1998 |
| JP | 11-102950 | | 4/1999 |
| JP | 2001-310316 | | 11/2001 |

OTHER PUBLICATIONS

Japanese Office Action; Dispatch No. 405522; Dispatch Date: Nov. 9, 2004.

T.J. Cochran et al., "Stacking Complex", IBM Technical Disclosure Bulletin, vol. 20 No. 11B, pp. 4670-4671, Apr. 1978.

T.A. Anzelone et al., "Handler With Transfer and Tray Orientor", IBM Technical Disclosure Bulletin, vol. 20, No. 11B, pp. 4672-4673, Apr. 1978.

* cited by examiner

MANUFACTURING APPARATUS FOR MANUFACTURING ELECTRONIC MONOLITHIC CERAMIC COMPONENTS

CROSS REFERENCE TO RELATED APPLICATION

This application is a divisional of application Ser. No. 09/893,399, filed Jun. 29, 2001 now U.S. Pat. No. 7,383,866.

BACKGROUND OF THE INVENTION

1. Field of the Invention

The present invention relates to manufacturing apparatuses for manufacturing electronic monolithic ceramic components and, more particularly, to a manufacturing apparatus for manufacturing an electronic monolithic ceramic component having a laminate that is formed by laminating a plurality of ceramic green sheets of a plurality of types in a predetermined order.

2. Description of the Related Art

When electronic monolithic ceramic components such as a multilayer ceramic board, a monolithic ceramic capacitor, and a monolithic ceramic inductor are manufactured, a step of laminating a plurality of ceramic green sheets of a plurality of types in a predetermined order is performed.

The ceramic green sheets laminated in the above-mentioned lamination step are supplied by a sheet supplier which typically sorts, and stacks a plurality of sheets according to the type.

For example, Japanese Unexamined Patent Application Publication No. 9-104016 discloses an apparatus which produces a laminate by supplying a plurality of ceramic green sheets of a desired type from a sheet supplier and by laminating the supplied ceramic green sheets according to a predetermined order.

The sheet supplier in the above-disclosed apparatus sorts ceramic green sheets of a plurality of types according to the type and prepares the ceramic green sheets ready to be supplied, and the plurality of ceramic green sheets is sorted according to the type while being arranged on a planar surface.

For this reason, the utilization efficiency of area in the sheet supplier is low, and the area needed to install a sheet supplier increases to meet the requirement for a diversity of ceramic green sheets to produce a desired electronic monolithic ceramic component.

SUMMARY OF THE INVENTION

The object of the present invention resolves the above-mentioned problem, and it is an object of the present invention to provide a manufacturing apparatus for manufacturing an electronic monolithic ceramic component.

The present invention is directed in one embodiment to a manufacturing apparatus for manufacturing electronic monolithic ceramic components, including a sheet supplier for supplying a plurality of ceramic green sheets of a plurality of types in a predetermined order, and a laminator for laminating the ceramic green sheets supplied by the sheet supplier, and an embodiment of the present invention has the following feature to resolve the above-described problem.

The sheet supplier of the manufacturing apparatus includes a plurality of trays for sorting and holding the plurality of ceramic green sheets of the plurality of types according to the type, and a rack for setting the plurality of trays in a vertical direction in alignment. Each of the trays is drawable from the rack, and each of the trays holds the plurality of ceramic green sheets of the same type stacked one above another.

The manufacturing apparatus further includes a tray drawer device for drawing the plurality of trays according to a predetermined order, and a conveyor device for picking up a single ceramic green sheet from the drawn tray and then conveying the ceramic green sheet to the laminator.

Preferably, the rack is raised and lowered in a vertical direction, and the tray drawer device draws a tray which is positioned at a predetermined height through the upward and downward movement of the rack.

Preferably, the conveyor device includes a chucking device for chucking a topmost ceramic green sheet of the stack of the ceramic green sheets in the tray for conveyance.

BRIEF DESCRIPTION OF THE DRAWINGS

FIGS. 18A, 18B, and 18C show an upper mold 46 arranged in a compression bonder device 11 shown in FIG. 2, wherein FIG. 18A is a top view of the upper mold 46, FIG. 18B is a front view of the upper mold 46 together with the laminator table 10, and FIG. 18C is a bottom view of the upper mold 46;

DESCRIPTION OF THE PREFERRED EMBODIMENTS

Figure 1:
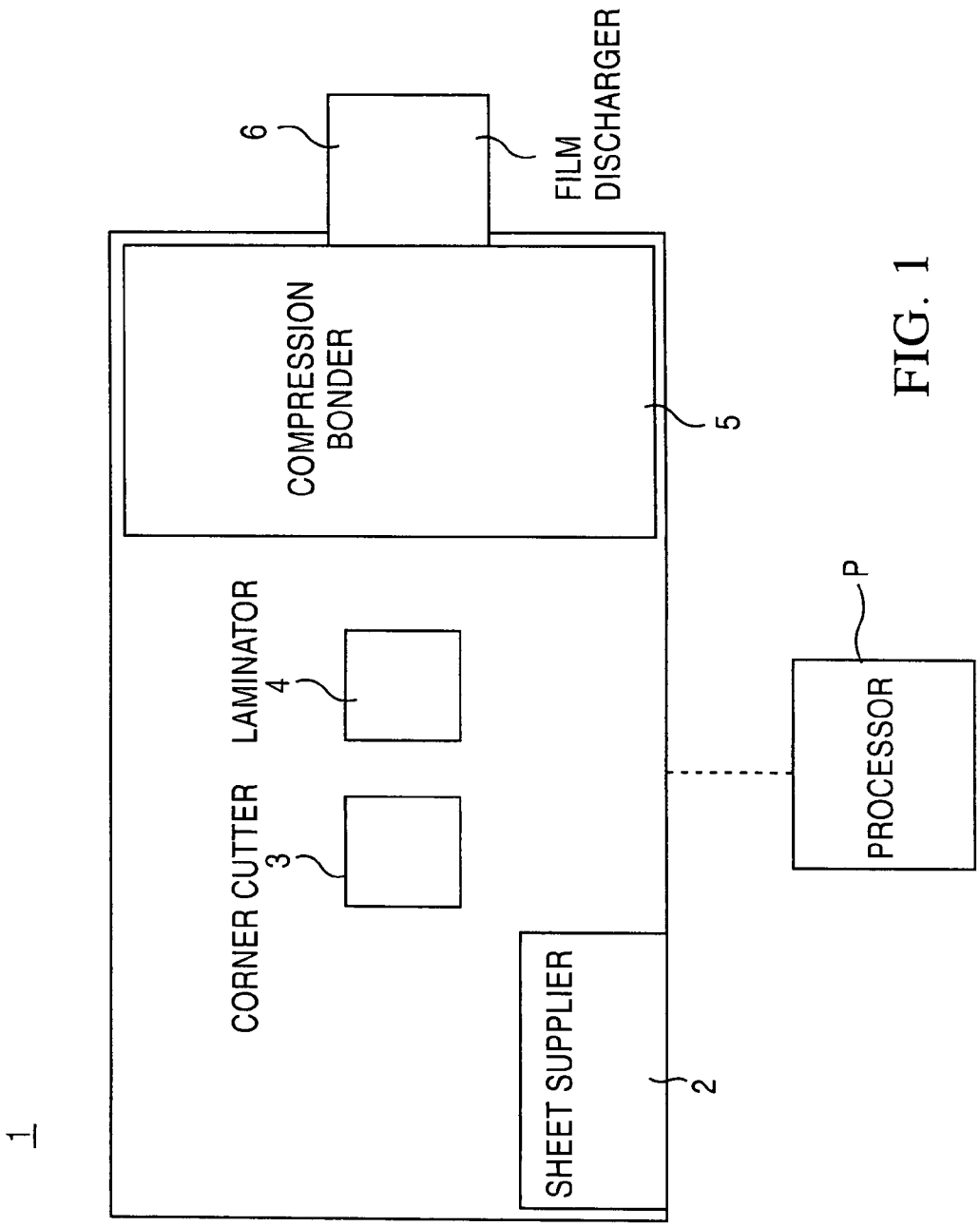
FIG. 1 is a plan view showing the layout of major work areas provided by a manufacturing apparatus 1 for manufacturing electronic monolithic ceramic components in accordance with one embodiment of the present invention.

FIG. 1 is a plan view showing the layout of major work areas provided by a manufacturing apparatus 1 for manufacturing electronic monolithic ceramic components in accordance with one embodiment of the present invention.

The manufacturing apparatus 1 includes, as the work areas thereof, a sheet supplier 2, a corner cutter 3, a laminator 4, a compression bonder 5, and a film discharger 6, and the work areas are arranged as shown in FIG. 1. Specific jobs carried out in the work areas 2 through 6 will be discussed later.

Figure 2:
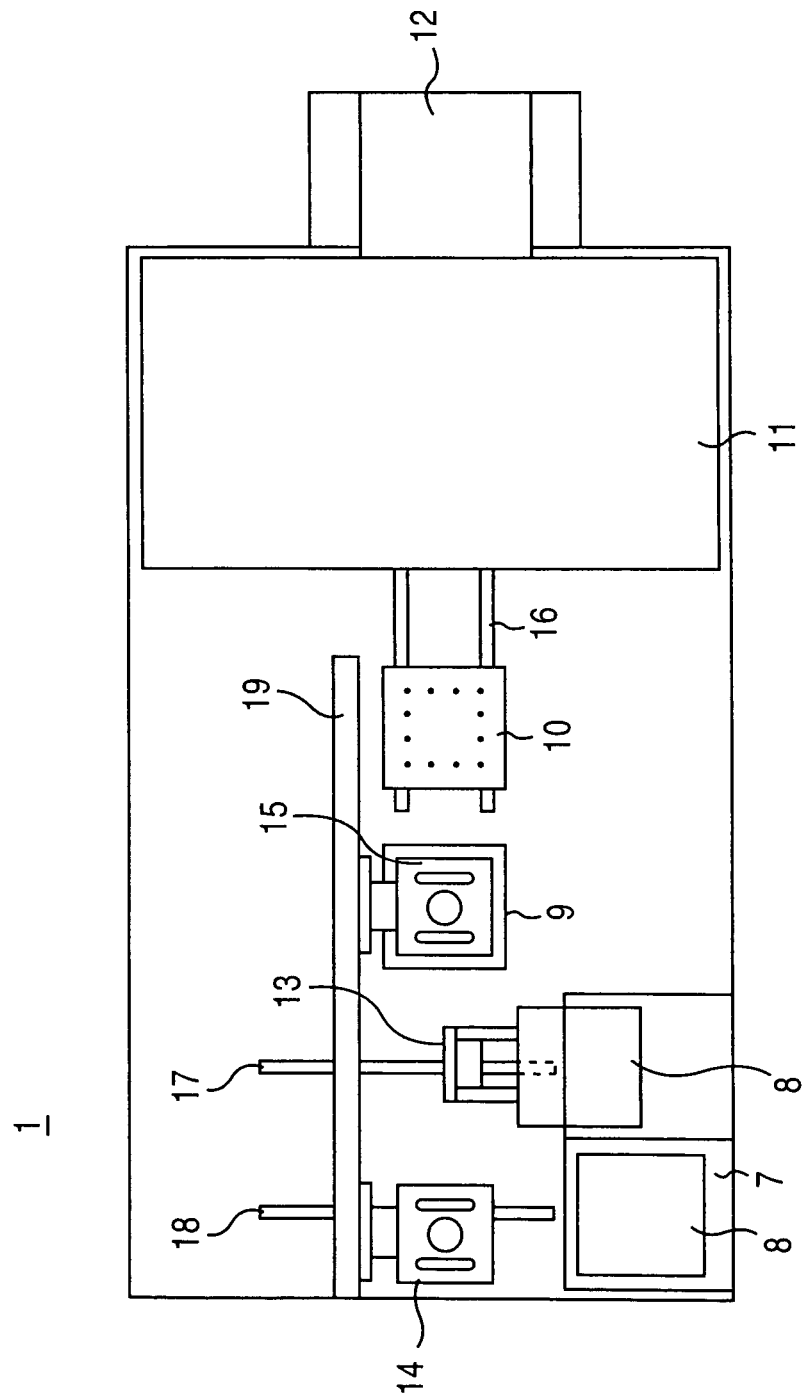
FIG. 2 is similar to FIG. 1, and is a plan view showing the general layout of the manufacturing apparatus 1.
Figure 3:
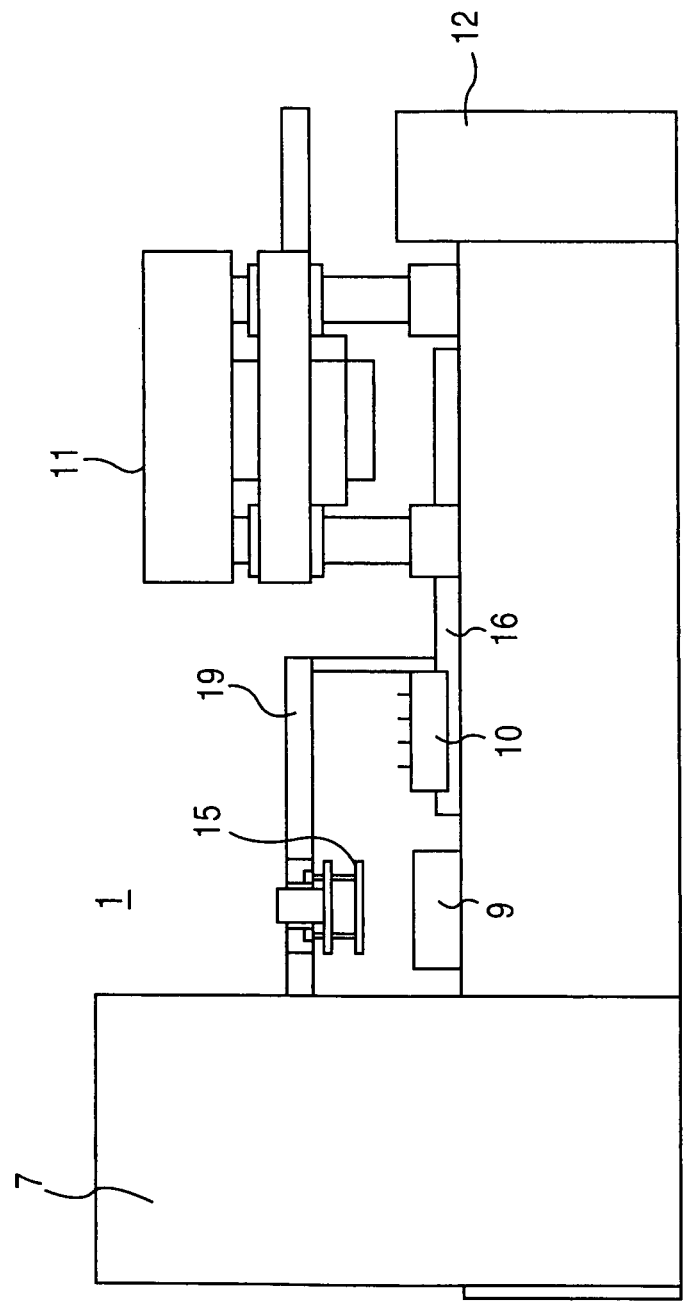
FIG. 3 is a front view generally showing the construction of the manufacturing apparatus 1.

FIG. 2 is similar to FIG. 1, and is a plan view showing the general layout of the manufacturing apparatus 1. FIG. 3 is a front view generally showing the construction of the manufacturing apparatus 1.

Referring to FIG. 1, the elements shown in FIG. 2 and FIG. 3 are discussed, and the sheet supplier 2 is provided with a rack 7. In the rack 7, a plurality of trays 8 holding ceramic green sheets to be discussed later are arranged in two parallel columns.

The corner cutter 3 includes a corner cutter table 9.

The laminator 4 includes a laminator table 10.

The compression bonder 5 includes a compression bonder device 11.

The film discharger 6 includes a film discharge tray 12.

A tray drawer device 13 is provided to work with the rack 7.

To convey the ceramic green sheets, a first chucking device 14 and a second chucking device 15 for chucking the ceramic green sheets through vacuum suction for conveyance are arranged.

The laminator table 10 reciprocatingly moves between the position thereof shown in FIG. 2 and FIG. 3 and the position thereof at the mounting location of the compression bonder device 11, and rails 16 are arranged to guide the movement of the laminator table 10.

The tray drawer devices 13 are used to draw the trays 8, and rails 17 and 18 are arranged to guide such a drawing operation of the tray drawer device 13. The tray drawer device 13 arranged to work with the rail 18 is not shown in FIG. 2 and FIG. 3.

The first chucking device 14 reciprocatingly moves between the tray drawer device 13 and the corner cutter table 9, the second chucking device 15 reciprocatingly moves between the corner cutter table 9 and the laminator table 10, and a rail 19 is provided to guide the movements of these devices.

Figure 4:
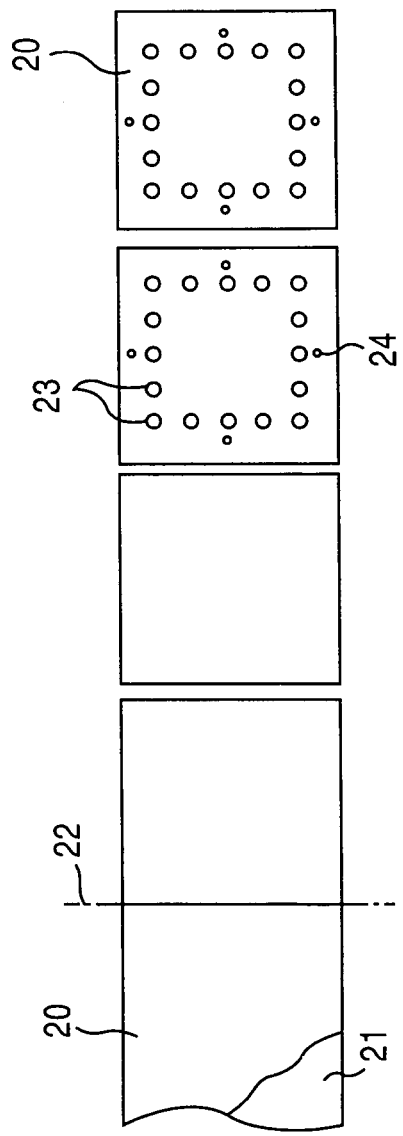
FIG. 4 is a plan view showing a step for obtaining a ceramic green sheet 20 supplied from the sheet supplier 2 shown in FIG. 1.

FIG. 4 shows ceramic green sheets 20 to be held in the trays 8 set in the rack 7 placed in the sheet supplier 2.

Referring to FIG. 4, a carrier film 21 as thick as 50 mm is prepared, and by applying a slurry of ceramic on the carrier film 21, the ceramic green sheet 20 is produced. To form the ceramic green sheet 20, a doctor blade method, a die coater method, a roll coater method, etc. may be used.

The thickness of the formed ceramic green sheet 20 falls within a range of 10 mm to 300 mm, and a plurality of types of green sheets 20 having different thicknesses is prepared depending on the design of desired electronic monolithic ceramic components.

The ceramic green sheet 20 lined with the carrier film 21 is stored in a roll, although not shown. The ceramic green sheet 20 is paid out from the roll, and is cut along a cut line 22 together with the carrier film 21 to a size of 150 mm by 150 mm, for example.

The ceramic green sheet 20 thus cut to the predetermined dimensions as described above has a plurality of pin insertion holes 23 and a plurality of reference holes 24, which also penetrate the carrier film 21. The pin insertion holes 23 and the reference holes 24 are concurrently opened using a die or a laser. In this way, no positional deviation takes place between the pin insertion holes 23 and the reference holes 24.

The pin insertion holes 23, each having a diameter of 3 to 5 mm, are opened on the peripheral portion of the rectangularly cut ceramic green sheet 20, specifically, at each corner and in the edge portion near the four sides of the ceramic green sheet 20. In this embodiment, five pin insertion holes 23 are arranged along each side of the ceramic green sheet 20 within an inward area of 3 to 7 mm from each side of the ceramic green sheet 20.

The reference holes 24, each having a size of 1 mm, are opened with one at the center of each edge portion near each side of the rectangularly cut ceramic green sheet 20.

Figure 5:
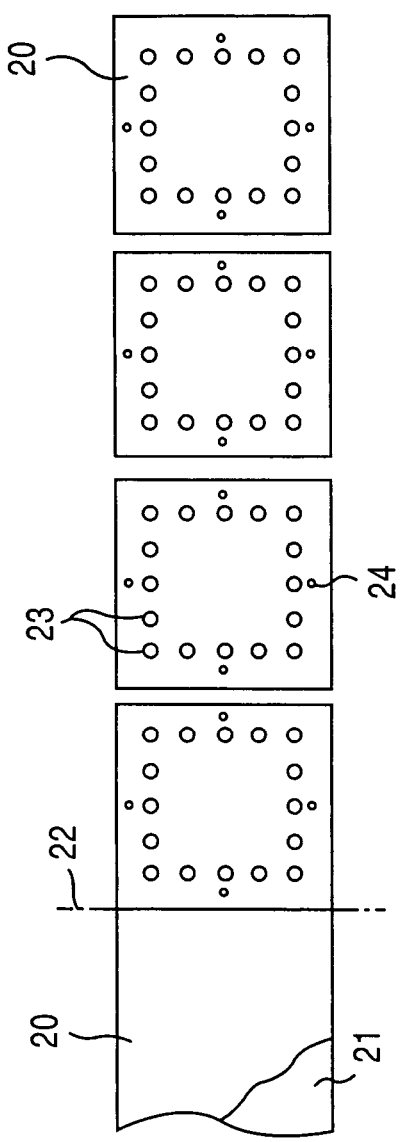
FIG. 5 is a plan view showing a modification of the step for obtaining the ceramic green sheet 20.

In the step described with reference to FIG. 4, the pin insertion holes 23 and the reference holes 24 are opened after cutting the ceramic green sheet, but alternatively, as shown in FIG. 5, the pin insertion holes 23 and the reference holes 24 may be opened in the ceramic green sheet 20 paid out from the roll and then the ceramic green sheet 20 may be cut to the predetermined dimensions. As shown in FIG. 5, elements identical to those with reference to FIG. 4 are designated with the same reference numerals and the discussion thereof is not repeated.

Figure 6:
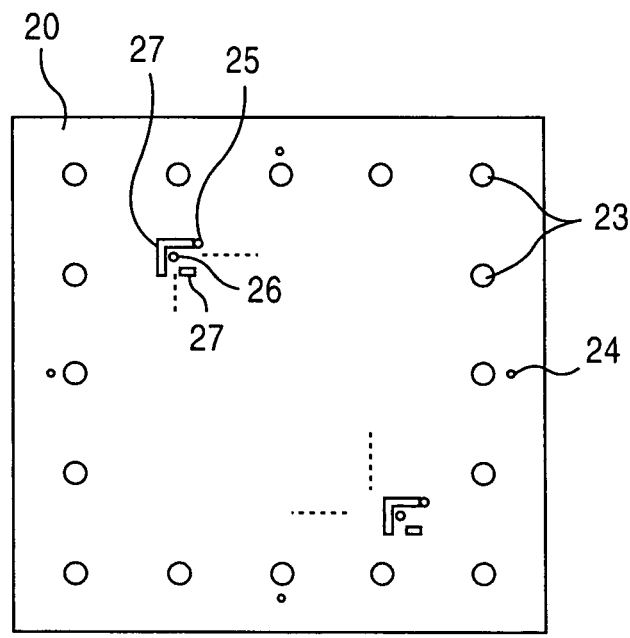
FIG. 6 is a plan view showing via holes 25 and conductive films 27 formed in the ceramic green sheet 20.

FIG. 6 shows a ceramic green sheet 20 cut to the predetermined dimensions. The ceramic green sheet 20 is then subjected to several processes depending on the design of a desired electronic monolithic ceramic component.

Referring to FIG. 6, via holes 25 are opened and then filled with an electrically conductive paste 26, and a conductive film 27 having a predetermined pattern is formed by printing an electrically conductive paste. The filling of the via holes 25 with the electrically conductive paste and the formation of the conductive film 27 may be performed at the same step or may be performed at different steps.

The electrically conductive paste 26 filling the via holes 25 and the electrically conductive paste for the conductive film 27 contain copper, nickel, and silver, or silver and palladium as an electrically conductive material.

A laser or a die is used to open the via holes 25.

To fill the via holes 25 with the electrically conductive paste 26, the electrically conductive paste 26 is preferably applied with the via holes 25 kept in a negative pressure state, and the application of the electrically conductive paste 26 may be performed on the side of the carrier film 21 with a mask applied on the carrier film 21 or may be performed on the side of the ceramic green sheet 20 using screen printing technique.

A CCD camera monitors the formation of the via holes 25, the filling of the via holes 25 with the electrically conductive paste 26, and the formation of the conductive film 27 by sensing the reference holes 24 and using the reference holes 24 as a position reference.

There are some ceramic green sheets 20 having a conductive film only, and other ceramic green sheets 20 having via holes filled with no electrically conductive paste. Some ceramic green sheets 20 have neither conductive film nor via holes.

Figure 7:
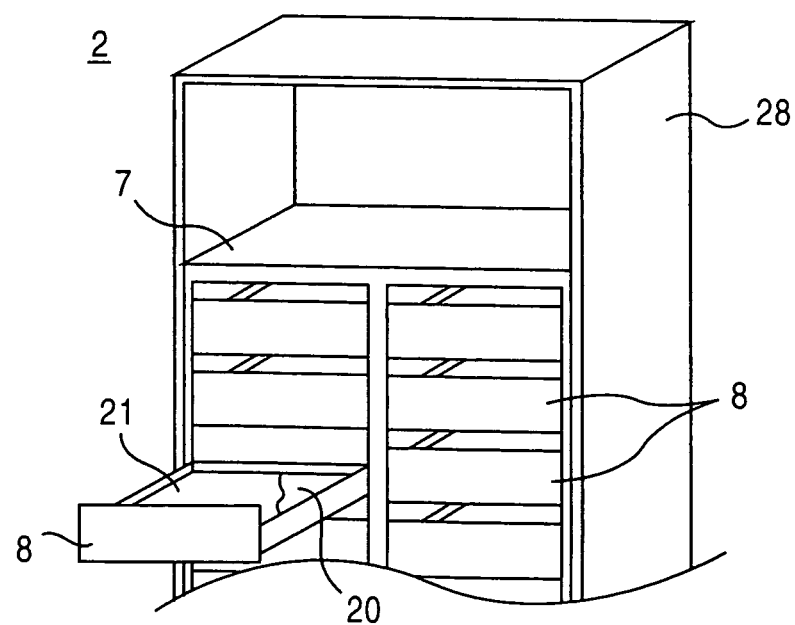
FIG. 7 is a perspective view showing part of a rack 7 arranged in the sheet supplier 2 shown in FIG. 1.
Figure 8:
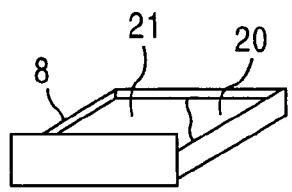
FIG. 8 is a perspective view of a single tray 8 set in the rack 7 shown in FIG. 7.

The ceramic green sheets 20 subjected to the above-described processes are sorted according to the type of process and the thickness thereof, and are placed into the respective trays 8 as shown in FIG. 7 and FIG. 8, and the trays 8 are set in vertical columns in the rack 7. As already discussed, a plurality of trays 8 is vertically set in two columns in the rack 7 as best seen from FIG. 7.

The rack 7 is housed in a frame 28, and is vertically raised and lowered using a lift mechanism (not shown). With the rack 7 raised and lowered, a particular tray 8 is moved to a predetermined level. Each of the trays 8 holds a plurality of ceramic green sheets 20 of the same type. By laminating ceramic green sheets held in a plurality of trays 8 in a predetermined order, a laminate of a desired electronic monolithic ceramic component is produced.

Referring to FIG. 7, the utilization efficiency of area is increased by setting a plurality of trays 8 in the rack 7, and without the need for increasing the area of the sheet supplier, the manufacturing apparatus handles a diversity of ceramic green sheets 20 to produce a desired electronic monolithic ceramic component.

In the embodiment shown, the plurality of trays 8 is arranged in two columns in the rack 7, but the number of columns may be one or may be three in the rack 7.

Figure 9:
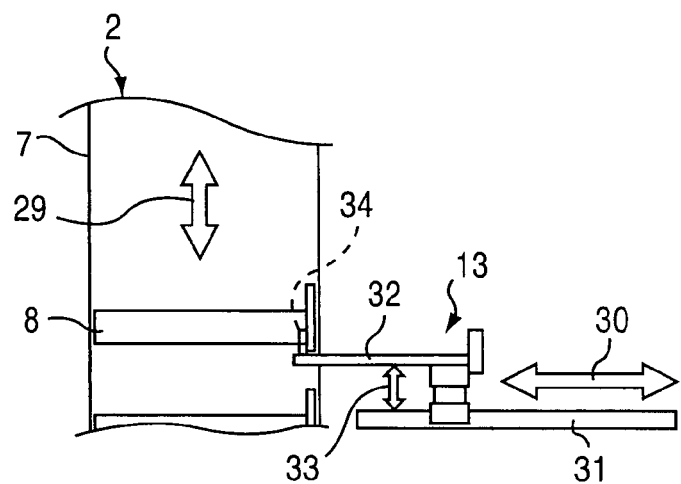
FIG. 9 is a side view showing the operation of a tray drawer device 13 shown in FIG. 2.

To pick up a desired ceramic green sheet 20, the tray drawer device 13 draws a particular tray 8 holding a desired ceramic green sheet 20 as shown in FIG. 7. FIG. 9 shows the tray drawer device 13 in detail.

Referring to FIG. 9, the rack 7 is raised or lowered as represented by an arrow 29 to a level as high as the tray drawer device 13. A chuck 32 travels along a rail 31 that extends in a direction represented by an arrow 30, and at one end of the travel, the chuck 32 is raised in a direction represented by an arrow 33, and pins provided on the end of the chuck 32 are mated with the tray 8. In succession, the chuck 32 travels in an opposite direction along the rail 31, thereby drawing the tray 8.

In this state, the previously-mentioned first chucking device 14 vacuum-chucks the topmost ceramic green sheet 20 in the tray 8 to convey it to the corner cutter table 9.

A ceramic green sheet 20 immediately beneath the topmost ceramic green sheet 20 vacuum-chucked by the first chucking device 14 may electrostatically adhere to the topmost ceramic green sheet 20, and that second ceramic sheet 20 may also be picked up together. To prevent this, the first chucking device 14 has preferably the following construction.

The chucking device 14 vacuum-chucks the ceramic green sheet 20 near opposed edges of the ceramic green sheet 20 and temporarily places the chucking points closer to each other at the moment of lifting the ceramic green sheet 20 to cause the ceramic green sheet 20 to sag. The sagging ceramic green sheet 20 forces the ceramic green sheet 20 therebeneath to separate therefrom.

After the first chucking device 14 picks up the ceramic green sheet 20, the chuck 32 travels along the rail 31 to put the tray 8 back to the rack 7. The first chucking device 14 lowers the chuck 32 in the direction represented by the arrow 33, disengages a lock pin 34 from a locking state thereof, and moves along the rail 31 out of the rack 7 to be on standby.

On standby, the first chucking device 14 is ready to start an operation to draw a next tray 8, and the time required to pick up the ceramic green sheet 20 is thus shortened.

As described above, the tray 8 is put back into the rack 7 after the desired ceramic green sheet 20 is picked up, and no tray is placed below the conveyance path of the first chucking device 14, and this arrangement reduces the possibility that the ceramic green sheet 20 in the tray 8 is contaminated with dirt falling in the course of conveyance.

In this embodiment, the ceramic green sheet 20 lined with the carrier film 21 is handled with the carrier film 21 facing upward. Referring to FIG. 7 and FIG. 8, each of the ceramic green sheets 20 held in the tray 8 is thus covered with the carrier film 21.

When the ceramic green sheet 20 is picked up, a processor unit (not shown) stores beforehand data concerning the types of, the lamination order of, and the number of ceramic green sheets 20 required to produce a laminate of a desired electronic monolithic ceramic component, and the processor thereby causes the tray 8 holding a required ceramic green sheet 20 to be drawn, and the first chucking device 14 to pick up the ceramic green sheets 20 one by one.

Figure 10:
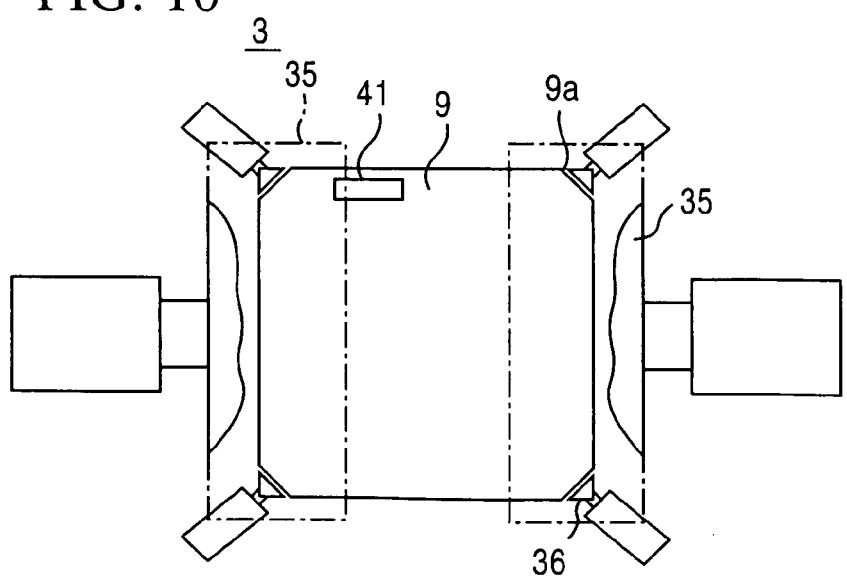
FIG. 10 is a plan view explaining the construction of a corner cutter 3 shown in FIG. 1.
Figure 11:
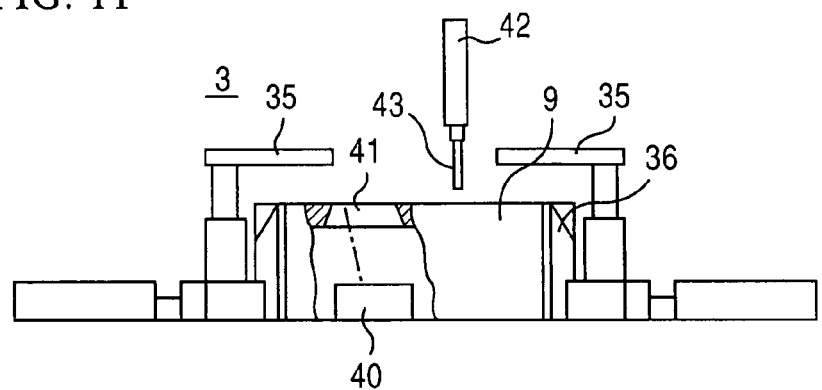
FIG. 11 is a plan view showing the corner cutter 3 shown in FIG. 10.

FIG. 10 and FIG. 11 show the corner cutter 3 of FIG. 1. FIG. 10 and FIG. 11 also show the corner cutter table 9 of FIG. 2 and FIG. 3.

The corner cutter 3 cuts and removes the four corners of the ceramic green sheet 20 lined with the carrier film 21. As a result, the carrier film 21 only remains at the four corners. The four corners of the carrier film 21 enable the carrier film 21 only to be gripped, and the carrier film 21 is thus peeled off the ceramic green sheet 20 by picking the carrier film 21 only in a peel step to be discussed later.

Pressure plates 35 are arranged above the corner cutter table 9. The pressure plates 35 are movable upward and downward. When moving downward, the pressure plates 35 press the ceramic green sheet 20 downward against the corner cutter table 9.

The corner cutter table 9 on the four corners thereof are cut away, forming bevels 9a, and a cutting edge 36 is arranged to be aligned with the bevel 9a. The operation of the cutting edge 36 is shown in FIGS. 12A, 12B, and 12C.

Figure 12A:
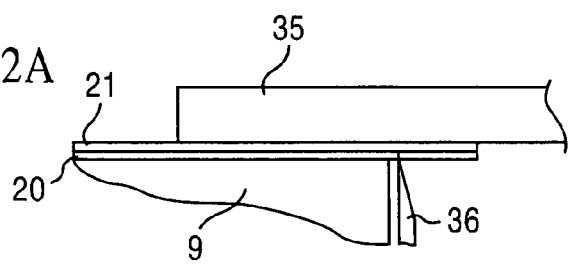
FIGS. 12A, 12B, and 12C are cross-sectional views showing the corner cutting operation of the corner cutter 3 shown in FIG. 10 and FIG. 11.

When the cutting edge 36 is raised, only the ceramic green sheet 20 at the four corners thereof are cut with the carrier film 21 remaining intact as shown in FIG. 12A.

Figure 12B:
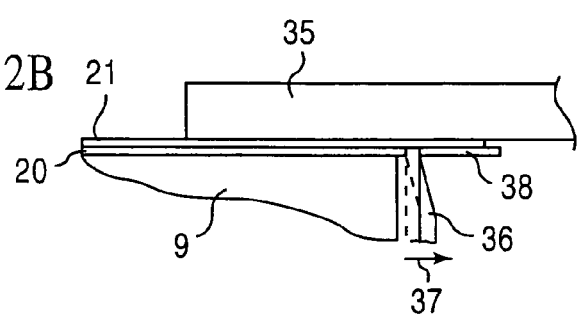

Referring to FIG. 12B, the cutting edge 36 laterally slides in a direction represented by an arrow 37, thereby removing each corner 38 from the ceramic green sheet 20. As a result, the carrier film 21 extends at the four corners thereof.

Figure 12C:
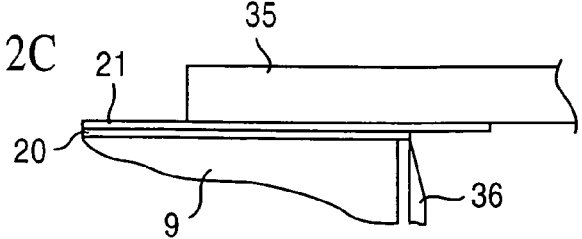

Referring to FIG. 12C, the cutting edge 36 is placed back to the original position thereof.

Figure 13:
FIG. 13 shows the modification of the operation of a cutting edge 36 shown in FIG. 12.

Referring to FIG. 13, the cutting edge 36 may be pivoted or swung about a predetermined pivotal point in a direction represented by an arrow 39.

The corner cutter 3 checks to see if the ceramic green sheet 20 mounted on the corner cutter table 9 needs laminating. For this reason, each ceramic green sheet 20 bears a mark indicating the type thereof. For example, such a mark is shown in a bar code. The bar code is printed at the same time as the previously-mentioned conductive film 27.

A bar code reader 40 is arranged below the corner cutter table 9 to read the bar code, and the corner cutter table 9 has a window 41 where the bar code comes to.

Instead of the bar code, or in cooperation with the bar code, a plurality of punched holes arranged in a code may be opened in the ceramic green sheet 20. The holes may be opened together with the previously-mentioned via holes 25 when the via holes 25 are opened. The punched holes may be monitored by a camera, for example.

In this embodiment, the thickness of the ceramic green sheet 20 placed on the corner cutter table 9 is checked. As shown in FIG. 11, a contact type dial gauge 42 is arranged above the corner cutter table 9. The dial gauge 42 measures the thickness of the ceramic green sheet 20 on the corner cutter table 9 by touching a measuring probe 43 to the ceramic green sheet 20, or more exactly, to the carrier film 21 on the corner cutter table 9.

The main purpose of the thickness measurement is to see if a plurality of ceramic green sheets 20 happens to be picked up by the first chucking device 14 from the tray 8 and happens to be undesirably stacked on the corner cutter table 9.

The thickness measurement may be performed using a non-contact type measurement device such as a laser displacement device.

When the bar code or the punched holes on the ceramic green sheet 20 indicating the type thereof are inappropriate, or when the thickness of the ceramic green sheet 20 is inappropriate, the ceramic green sheet 20 is removed from the corner cutter table 9.

The reading of the bar code or the punched holes and thickness measurement by the dial gauge 42 may be performed substantially in parallel or sequentially one after the other.

In this embodiment, the corners of the ceramic green sheet 20 are cut on the corner cutter table 9 subsequent to the checking of the ceramic green sheet 20, but alternatively, the checking step for the ceramic green sheet 20 may be performed in a place other than the corner cutter 3, and thereafter only the ceramic green sheets 20 that have passed the check may be conveyed to the corner cutter 3.

The ceramic green sheet 20 having undergone corner cutting on the corner cutter table 9 is transported on the laminator table 10 by the second chucking device 15 as already discussed.

The previously-mentioned first chucking device 14 may be used to transport the ceramic green sheet 20 from the corner cutter table 9 to the laminator table 10 with the second chucking device 15 dispensed with.

Figure 14:
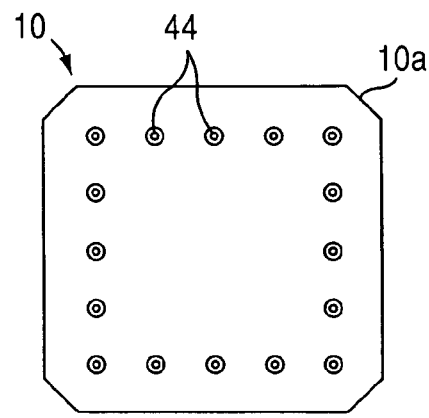
FIG. 14 is a plan view showing a laminator table 10 shown in FIG. 2.
Figure 15:
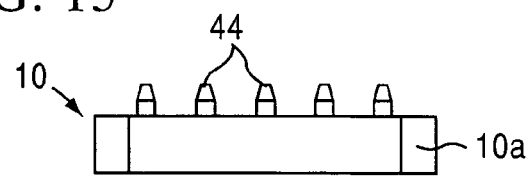
FIG. 15 is a front view showing the laminator table 10 shown in FIG. 14.

FIG. 14 and FIG. 15 are respectively a plan view and a front view of the laminator table 10.

The laminator table 10 has bevels 10a with the four corners cut away. A plurality of guide pins 44 are arranged on the laminator table 10. The guide pins 44 are to be respectively inserted into the pin insertion holes 23 opened in the ceramic green sheet 20, and have the same layout as that of the pin insertion holes 23.

The diameter of the guide pin 44 is substantially equal to the diameter of the pin insertion hole 23, and as already discussed, when the diameter of the pin insertion hole 23 is 3 to 5 mm, the diameter of the guide pin is also 3 to 5 mm. If the guide pin 44 is substantially smaller in diameter than the pin insertion hole 23, the alignment accuracy of the ceramic green sheet 20 is degraded, and conversely, if the guide pin 44 is larger in diameter than the pin insertion hole 23, the guide pin 44 cannot be inserted into the pin insertion hole 23, and an insertion attempt of the guide pin 44 may damage the ceramic green sheet 20 in the vicinity of the pin insertion hole 23.

Each of the guide pins 44 is preferably tapered toward the end thereof.

Since the guide pins 44 are supported in such a manner as to move upward and downward relative to the laminator table 10, the guide pins 44 take the projected state thereof as shown in FIG. 15 and the unshown retracted-state thereof.

When a plurality of ceramic green sheets 20 is laminated on the laminator table 10, an under sheet 45 not shown in FIG. 4 and FIG. 5 is preferably arranged on and in contact with the laminator table 10. The under sheet 45 is shown in FIG. 19A-19E, FIG. 21 and other figures. The under sheet 45 is fabricated of a plastic sheet having a surface roughness, for example.

The laminator table 10 preferably has a means for fixing the under sheet 45 thereon. The under sheet 45 is fixed on the laminator table 10 using an adhesive means, vacuum chucking, or a mechanical means.

When the under sheet 45 is fixed on the laminator table 10 through vacuum chucking, a plurality of suction holes is opened in the laminator table 10, and the under sheet 45 is vacuum-chucked onto the laminator table 10. The cross-sectional shape of the suction hole may be discretionary, and has preferably a diameter within a range from 0.4 to 1.0 mm. If the diameter is smaller than 0.4 mm, a machining process for drilling the suction hole becomes difficult, and resulting chucking power is not sufficient, and if the diameter is larger than 1.00 mm, the suction hole print remains on the ceramic green sheet 20, making the ceramic green sheet 20 aesthetically unacceptable or damaging the ceramic green sheet 20 in extreme cases.

Figure 16:
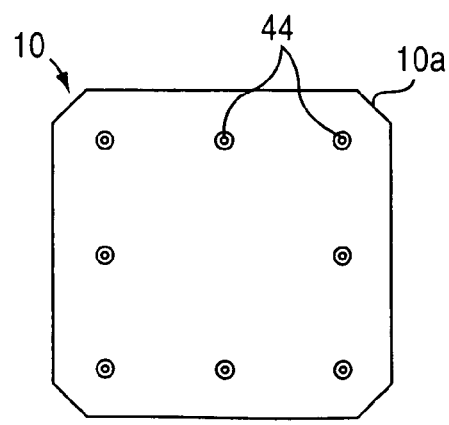
FIG. 16 is a plan view showing a first modification of the laminator table 10.
Figure 17:
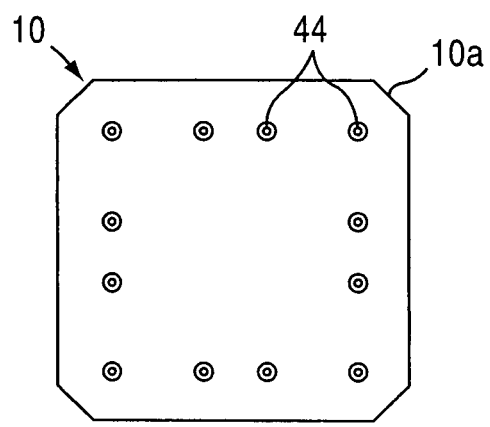
FIG. 17 is a plan view showing a second modification of the laminator table 10.

The layout of the guide pins 44 in the laminator table 10 is determined to be in alignment with the layout of the pin insertion holes 23 in the ceramic green sheet 20, and when the layout of the pin insertion holes 23 is modified as shown in FIG. 16 or FIG. 17, the guide pins 44 are arranged accordingly in the laminator table 10.

Referring to FIG. 16, the guide pins 44 are arranged with one at each of the four corners and with one at the center of the edge portion of each side, and as a result, three guide pins 44 are arranged at each side of the laminator table 10.

Referring to FIG. 17, the guide pins 44 are arranged with one at each of the four corners and with two offset to the center of the edge portion of each side, and as a result, four guide pins 44 are arranged.

The guide pins 44 are arranged in such a manner as to prevent the ceramic green sheet 20 from being deformed in a compression bonding step to be discussed later.

As already discussed, the ceramic green sheet 20 that has undergone the corner cutting step in the corner cutter 3 is then conveyed to the laminator 4 by the second chucking device 15, and is then laminated on the under sheet 45 on the laminator table 10. Each time the laminator 4 completes lamination, the laminator table 10 is moved along the rails 16 to a position below the compression bonder device 11 of the compression bonder 5.

Figure 18A:
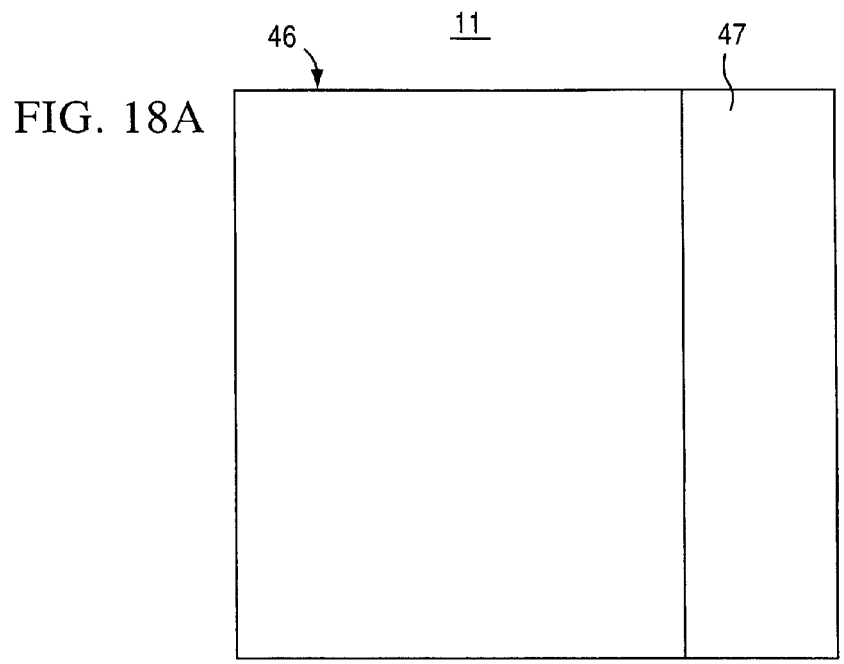
Figure 18B:
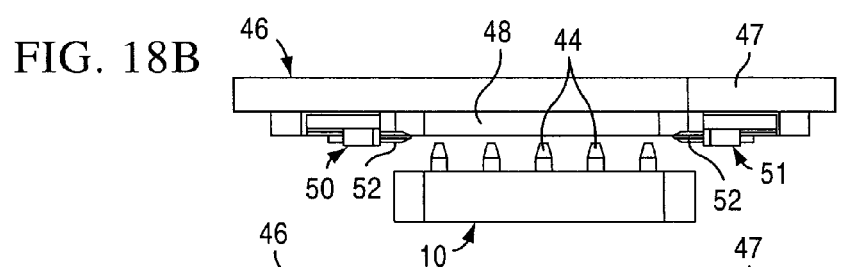
Figure 18C:
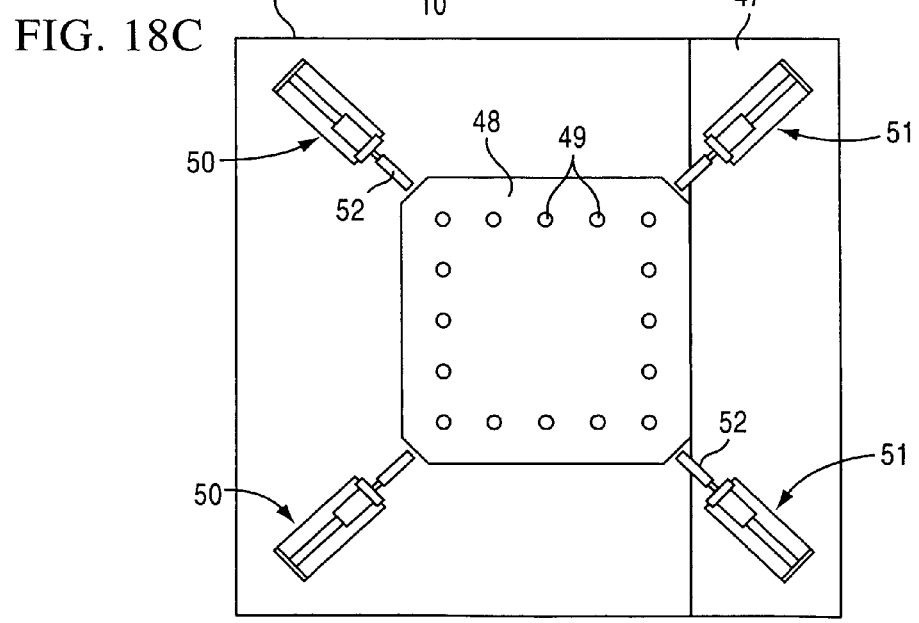

Referring to FIGS. 18A-18C, there is shown an upper mold 46 provided in the compression bonder device 11 of the compression bonder 5. FIG. 18A is a top view of the upper mold 46, and FIG. 18B is a front view of the upper mold 46 together with the laminator table 10, and FIG. 18C is a bottom view of the upper mold 46.

The upper mold 46 is generally driven in a vertical direction. A portion of the upper mold 46 constitutes a movable section 47, which is laterally movable to be separated from the rest of the upper mold 46.

Provided on the underside of the upper mold 46 is a compression bonding member 48 having a compression bonding surface. Referring to FIG. 18C, the compression bonding member 48, with a planar shape substantially identical to that of the laminator table 10, has bevels 48a with the four corners thereof cut away. The compression bonding member 48 has on the compression bonding surface thereof relief holes 49 that receive the guide pins 44 projecting from the laminator table 10.

Provided on the underside of the upper mold 46 are gripping mechanisms 50 and 51 facing the respective bevels 48a of the four corner of the compression bonding member 48. The gripping mechanisms 51 out of the gripping mechanisms 50 and 51 are arranged on the movable section 47.

The gripping mechanisms 50 and 51 are substantially identical to each other in structure, and respectively include chucks 52 for gripping the corners of the carrier film 21, and the chuck 52 is openable and closable to release or to grip the carrier film 21, and is movable in diagonal lines to approach and go away from the compression bonding member 48.

FIGS. 19A-19E show the operation of the upper mold 46 of the compression bonder device 11.

Figure 19A:
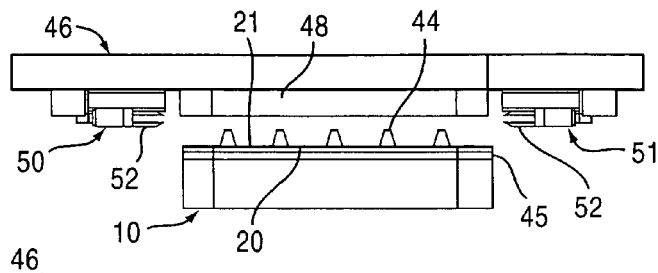
FIGS. 19A-19E are a front view showing the operation of the upper mold 46 shown in FIGS. 18A-18C.

FIG. 19A shows the laminator table 10 in its position shifted below the upper mold 46. The ceramic green sheet 20 having predetermined dimensions and lined with the carrier film 21 is placed on the under sheet 45 on the laminator table 10. The ceramic green sheet 20 and the carrier film 21 are aligned with the laminator table 10 with the guide pins 44 received by the pin insertion holes 23. The ceramic green sheet 20 has no corners because it has undergone the corner cutting step in the corner cutter 3.

Figure 19B:
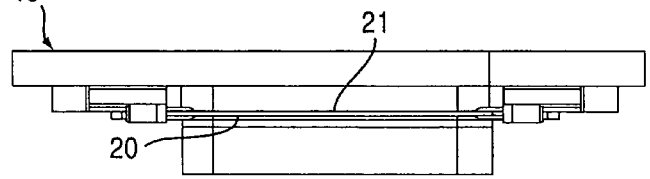

Referring to FIG. 19B, the upper mold 46 is lowered, and the compression bonding member 48 presses the ceramic green sheet 20. The chucks 52 of the respective gripping mechanisms 50 and 51 move in such a manner to receive the corners of the carrier film 21 and then close themselves to grip the corners of the carrier film 21.

Figure 19C:
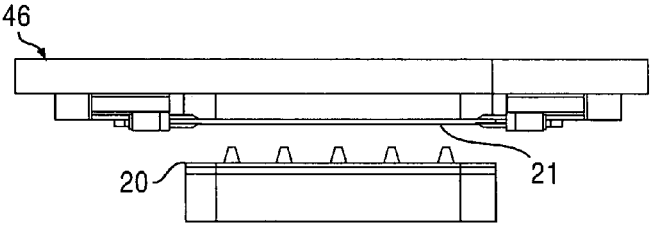

Referring to FIG. 19C, the upper mold 46 is raised. Since the chucks 52 of the respective gripping mechanisms 50 and 51 grip the corners of the carrier film 21, the carrier film 21 is peeled off the ceramic green sheet 20 as the upper mold 46 is raised.

Figure 19D:
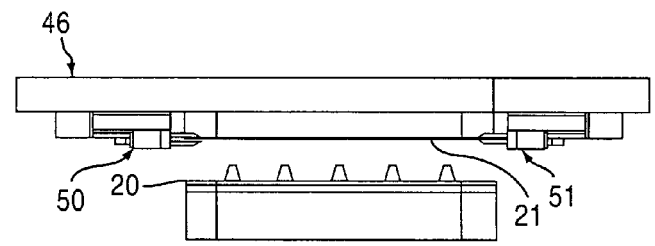

Referring to FIG. 19D, the chucks 52 of the gripping mechanisms 50 are opened to release the carrier film 21. On the other hands, the chucks 52 of the gripping mechanisms 51 continuously grip the carrier film 21.

Figure 19E:
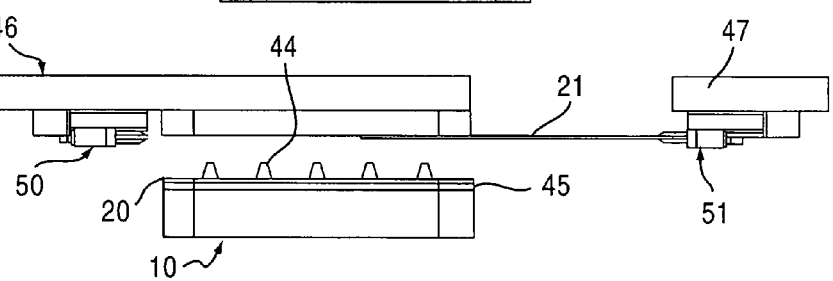

Referring to FIG. 19E, the movable section 47 laterally moves with the chucks 52 of the gripping mechanisms 51 continuously gripping the carrier film 21. At the end of the travel, the carrier film 21 is positioned above the film discharge tray 12 arranged in the film discharger 6 shown in FIG. 1 through FIG. 3. At the end of the travel, the chucks 52 of the gripping mechanisms 51 are then opened, releasing the carrier film 21 into the film discharge tray 12.

The laminator table 10 is then moved back to the laminator 4 as shown in FIG. 1 to be on standby for laminating a next ceramic green sheet 20.

The process from the picking of the ceramic green sheet 20 from the tray 8 to the compression bonding of the ceramic green sheet 20 to the peeling of the carrier film 21 as discussed above is repeated until a desired electronic monolithic ceramic component is produced.

In the above-described compression bonding step, the ceramic green sheet 20 is preferably heated to a temperature within a range from 40 to 100° C.

Further, in the compression bonding step, the ceramic green sheet 20 is put under a pressure within a range from 200 to 350 Kg/cm². In this case, conditions applied on the ceramic green sheet 20, such as compression time and pressure, may be modified depending on the types and quantities of a ceramic material and a binder contained in the ceramic green sheet 20, the peel property of the carrier film 21, the area of the conductive film 27 formed on the ceramic green sheet 20, and the lamination order of a current ceramic green sheet 20 among all layers.

Figure 20:
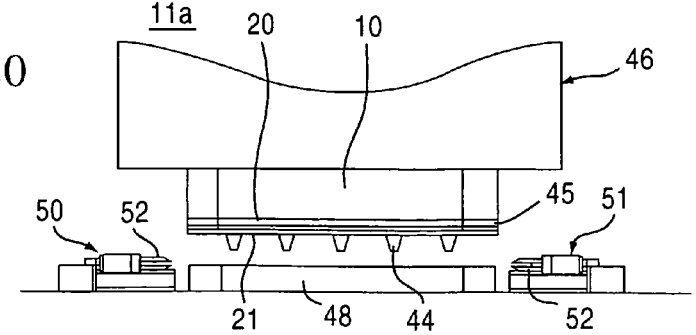
FIG. 20 is a front view showing a modification of a compression bonder device.

FIG. 20 shows a modification of the compression bonder device. As shown in FIG. 20, elements identical to those described with reference to FIGS. 18A-18C and FIGS. 19A-19E are designated with the same reference numerals, and the discussion thereof is not repeated.

The compression bonder device 11a shown in FIG. 20 has a topside down version of the compression bonder device 11. Specifically, the upper mold 46 holds the laminator table 10, and arranged below the laminator table 10 are the compression bonding member 48 and the gripping mechanisms 50 and 51.

As discussed above, when lamination of the ceramic green sheet 20 required to produce a laminate is completed, the laminate 53 (see FIG. 21 or FIG. 22) is taken out together with the under sheet 45. When the laminate 53 is picked up, the guide pins 44 arranged on the laminator table 10 are lowered for retraction. This is intended to prevent the guide pins 44 from erratically interfering with the laminate 53 when the laminate 53 is discharged.

Figure 21:
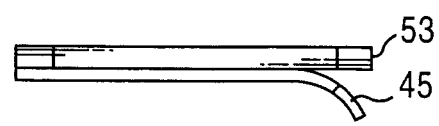
FIG. 21 is a front view showing the state in which an under sheet 45 is peeled off a laminate 53.

The discharged laminate 53 with the under sheet 45 attached thereto is cooled to room temperature, and then the under sheet 45 is peeled off as shown in FIG. 21. In this way, the laminate 53 is protected from unwanted stretch or deformation.

Figure 22:
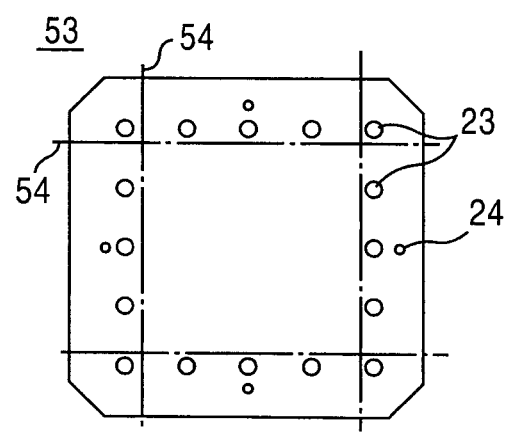
FIG. 22 is a plan view showing a step of cutting the peripheral portion of the laminate 53.

Referring to FIG. 22, the laminate 53 is diced along cut lines 54 to remove areas including the pin insertion holes 23 and the reference holes 24 therewithin. In a press step to be performed later, this dicing step prevents the laminate 53 from being stretched or deformed by the presence of the pin insertion holes 23 and the reference holes 24.

The laminate 53 is then placed on a press die assembly composed of an upper punch and a lower notched die, although not shown, and then a press step using a rigid-body press is performed on the laminate 53, thereby pressing the laminate 53 in the direction of lamination.

By increasing the pressure applied in the compression bonding step, the press step may be skipped.

The laminate 53 is diced by a dicing saw or a cutting edge to obtain a laminate chip for individual electronic monolithic ceramic components.

The laminate chip is then sintered. External surfaces, for example, end faces of the sintered laminate chip are coated with an electrically conductive paste including an electrically conductive component such as copper, silver, nickel, or the like, and is then dried, and baked to form external electrodes. The external electrodes are then plated with nickel and/or tin, as necessary.

To form the external electrode, an electrically conductive paste may be applied on the laminate chip prior to sintering, and baking for forming external electrodes may be performed concurrently with the sintering of the laminate chip. In this case, the electrically conductive paste for forming the external electrodes is preferably fabricated of an electrically conductive paste containing substantially the same component as that for the electrically conductive paste 26 filling the previously-referenced via holes 25 and the electrically conductive paste forming the conductive film 27.

In this way, a desired electrical monolithic ceramic component is manufactured.

As described above, to manufacture electronic monolithic ceramic components, a sheet supplier for supplying a plurality of ceramic green sheets of a plurality of types in a predetermined order to a laminator for laminating the ceramic green sheets includes a plurality of trays for sorting and holding the plurality of ceramic green sheets of the plurality of types according to the type, and a rack for setting the plurality of trays in a vertical direction in alignment, and for this reason, the utilization efficiency of area in the sheet supplier is high, and the manufacturing apparatus handles a diversity of ceramic green sheets to produce a desired electronic monolithic ceramic component.

In accordance with this invention, each of the trays can be drawn from the rack, and the manufacturing apparatus further includes the tray drawer device for drawing the plurality of trays according to a predetermined order, and a conveyor device for picking up a single ceramic green sheet from the drawn tray and then conveying the ceramic green sheet to the laminator, and thus after a desired ceramic green sheet is picked up, the tray is placed in the rack. Since the tray is placed in the rack during the conveyance of the ceramic green sheet by the conveyor device, there is a low possibility that the ceramic green sheet in the tray is contaminated with dirt falling in the course of conveyance.

In accordance with the present invention, the rack is raised and lowered in a vertical direction, and the tray drawer device draws a tray which is positioned at a predetermined height through the upward and downward movement of the rack, and the tray drawer device is thus operated at the predetermined height, and components associated with the tray drawer device are of a simple construction.

In accordance with the present invention, the conveyor device includes a chucking device for chucking a topmost ceramic green sheet of the stack in the tray for conveyance, and a single ceramic green sheet is easily picked up from among a plurality of ceramic green sheets in each tray.

What is claimed is:

1. A manufacturing method for manufacturing electronic monolithic ceramic components, the manufacturing method comprising the steps of:
    preparing a ceramic green sheet lined with a carrier film;
    opening a pin insertion hole and a reference hole concurrently in the ceramic green sheet at a peripheral portion, the pin insertion hole and reference hole also penetrate the carrier film, wherein the pin insertion hole is for stacking at a peripheral portion of the ceramic green sheet and the reference hole is for providing a positional determination of the ceramic green sheet;
    sensing the reference hole and using the reference hole as a reference for positional determination to apply an electrically conductive paste to the ceramic green sheet;
    producing a lamination by
        placing the ceramic green sheet with carrier film on a laminator table with the carrier film being an upper side;
        inserting a guide pin into the pin insertion hole for alignment on the laminator table;
        pressing the ceramic green sheet and carrier film to produce a lamination;
        peeling off the carrier film and discharging the peeled carrier film to a film discharger; and
        repeating the lamination steps until a desired product is produced;
    removing the portion where the pin insertion hole and reference hole are opened out of the lamination.

2. The manufacturing method for manufacturing electronic monolithic ceramic components according to claim 1, wherein said manufacturing method includes, using the reference hole as a reference for positional determination, at least one step among steps of forming a via hole on the ceramic green sheet, and filling the via hole with the electrically conductive paste.

3. The manufacturing method for manufacturing electronic monolithic ceramic components according to claim 1, wherein the ceramic green sheet is a quadrangle, and the pin insertion hole is opened at each corner of the ceramic green sheet and area along each side of the ceramic green sheet.

4. The manufacturing method for manufacturing electronic monolithic ceramic components according to claim 2, wherein the ceramic green sheet is a quadrangle, and the pin insertion hole is opened at each corner of the ceramic green sheet and area along each side of the ceramic green sheet.

5. The manufacturing method for manufacturing electronic monolithic ceramic components according to claim 1, further comprising the steps of providing an undersheet on and in contact with the laminator table, the undersheet being fabricated of a plastic sheet having a surface roughness, and in a heated condition, laminating the ceramic green sheet on the undersheet.

6. The manufacturing method for manufacturing electronic monolithic ceramic components according to claim 5, further comprising the steps of discharging the lamination with attached undersheet from the laminator table, cooling down the lamination and undersheet to room temperature and peeling off the undersheet from the lamination.

7. The manufacturing method for manufacturing electronic monolithic ceramic components according to claim 1, wherein the step of pressing the lamination after removal of the pin insertion hole includes the steps of placing the lamination on a press die assembly and pressing the lamination in a direction of lamination.

8. A manufacturing method for manufacturing electronic monolithic ceramic components, the manufacturing method comprising the steps of:
    preparing a ceramic green sheet lined with a carrier film;
    opening a pin insertion hole and a reference hole concurrently in the ceramic green sheet at a peripheral portion, the pin insertion hole and reference hole also penetrate the carrier film, wherein the pin insertion hole is for stacking at a peripheral portion of the ceramic green sheet and the reference hole is for providing a positional determination of the ceramic green sheet;
    sensing the reference hole and using the reference hole as a reference for positional determination to apply an electrically conductive paste to the ceramic green sheet;
    producing a lamination by
        placing the ceramic green sheet with carrier film on a laminator table with the carrier film being an upper side;
        inserting a guide pin into the pin insertion hole for alignment on the laminator table;
        pressing the ceramic green sheet and carrier film to produce a lamination;
        peeling off the carrier film and discharging the peeled carrier film to a film discharger;
        repeating the lamination steps until a desired product is produced; and
        removing the portion where the pin insertion hole and reference hole are opened out of the lamination;
    wherein the ceramic green sheet lined with the carrier film each include at least one corner and said at least one corner of said ceramic green sheet is cut and removed while the corner of said carrier film remains.

\* \* \* \* \*